United States Patent
Butler et al.

(10) Patent No.: US 9,960,819 B2
(45) Date of Patent: May 1, 2018

(54) SYSTEMS AND METHODS FOR MULTI-MODE INDUCTIVELY COUPLES COMMUNICATION

(71) Applicant: QUALCOMM Incorporated, San Diego, CA (US)

(72) Inventors: Paul Butler, San Jose, CA (US); Magnus Wiklund, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 14/862,589

(22) Filed: Sep. 23, 2015

(65) Prior Publication Data
US 2017/0085299 A1    Mar. 23, 2017

(51) Int. Cl.
| | |
|---|---|
| H04B 5/00 | (2006.01) |
| H04W 4/00 | (2018.01) |
| H04L 27/32 | (2006.01) |
| H04L 25/02 | (2006.01) |
| H04L 12/26 | (2006.01) |
| H03F 1/56 | (2006.01) |
| H03F 3/21 | (2006.01) |
| H03F 3/19 | (2006.01) |
| H04B 1/403 | (2015.01) |
| H04B 1/58 | (2006.01) |

(52) U.S. Cl.
CPC .......... *H04B 5/0075* (2013.01); *H03F 1/565* (2013.01); *H03F 3/19* (2013.01); *H03F 3/211* (2013.01); *H04B 1/406* (2013.01); *H04B 1/58* (2013.01); *H04B 5/0031* (2013.01); *H04L 25/0202* (2013.01); *H04L 27/32* (2013.01); *H04L 43/103* (2013.01); *H04W 4/008* (2013.01); *H03F 2200/451* (2013.01)

(58) Field of Classification Search
CPC ....... H04B 3/32; H04B 5/0018; H04B 1/1027
USPC .......................... 455/41.1, 41.2, 41.3, 67.13
See application file for complete search history.

(56) References Cited

U.S. PATENT DOCUMENTS

| | | | |
|---|---|---|---|
| 8,260,241 B1 | 9/2012 | Hyde | |
| 2009/0196373 A1* | 8/2009 | Snook | G06K 7/0008 375/269 |
| 2013/0324036 A1 | 12/2013 | Hillan et al. | |
| 2014/0312123 A1* | 10/2014 | Lin | G06K 19/07754 235/492 |

(Continued)

FOREIGN PATENT DOCUMENTS

| | | |
|---|---|---|
| WO | 2014029530 A1 | 2/2014 |
| WO | 2014041049 A1 | 3/2014 |

OTHER PUBLICATIONS

Minihold R., "Near Field Communication (NFC) Technology and Measurements," White Paper, Jun. 2011, 1MA182_5e, pp. 1-18.

(Continued)

*Primary Examiner* — Ping Hsieh
(74) *Attorney, Agent, or Firm* — Austin Rapp

(57) ABSTRACT

A method for inductively coupled communication is described. The method includes determining an operational mode for inductively coupled communication. The method also includes performing the operational mode by combining a transmit power amplifier (PA) output replica and a PA output copy at a signal combining block of a receiver. The PA output replica reflects effects of channel properties. The PA output copy is unaffected by the channel properties.

33 Claims, 12 Drawing Sheets

(56) References Cited

U.S. PATENT DOCUMENTS

| | | |
|---|---|---|
| 2014/0378053 A1 | 12/2014 | Clarke |
| 2015/0200466 A1* | 7/2015 | Yoon ...................... H01Q 21/28 |
| | | 455/73 |
| 2015/0215105 A1 | 7/2015 | Velitheri et al. |
| 2015/0270865 A1* | 9/2015 | Polydoros ................ H04B 1/62 |
| | | 375/346 |

OTHER PUBLICATIONS

International Search Report and Written Opinion—PCT/US2016/048683—ISA/EPO—dated Nov. 22, 2016.

\* cited by examiner

SYSTEMS AND METHODS FOR MULTI-MODE INDUCTIVELY COUPLES COMMUNICATION

TECHNICAL FIELD

The described technology generally relates to an apparatus and method of wireless communication. More particularly, the technology relates to multiple operational modes in near-field communication (NFC).

BACKGROUND

The wireless communication environment in a home or an office generally includes a number of independently developed radio access technologies and standards. These technologies were initially designed for target applications and they perform relatively well for these applications. In a typical home or office environment, an access to content (e.g., web, video, etc.) is provided to a broadband modem through the home-owner's IP backhaul connection. For instance, mobile services are provided through the cellular network, through either a macro cell or a femto cell located within the home or office. Wireless local area network (WLAN) access points (APs) provide data connectivity between computers, cell phones, laptops, printers, and other wireless stations using 802.11-based Wi-Fi technology.

Another communication medium currently being implemented in electronic equipment is near-field communication (NFC). NFC is an inductively coupled communication technology. The use of NFC interfaces in electronic equipment provides portable devices with functions similar to those of non-contact integrated circuit cards (e.g., radio frequency identification (RFID) cards). In addition, electronic equipment provided with NFC interfaces is typically capable of operating as radio frequency (RF) readers and/or writers to communicate with other NFC devices.

A wireless communication device may communicate with a remote device using NFC technology. Benefits may be realized by using a single transmitter and receiver to perform multiple operational modes in NFC.

SUMMARY

A method for inductively coupled communication is described. The method includes determining an operational mode for inductively coupled communication. The method also includes performing the operational mode by combining a transmit power amplifier (PA) output replica and a PA output copy at a signal combining block of a receiver. The PA output replica reflects effects of channel properties. The PA output copy is unaffected by the channel properties.

The channel properties may include loading conditions in relation to at least one of an antenna, matching network, coupling to a remote device, or load modulation.

In an implementation, the signal combining block may perform time domain summing of the PA output replica and the PA output copy. The PA output copy may be subtracted from the PA output replica. In another implementation, the signal combining block may perform frequency translation.

Phase, frequency and amplitude alignments of the PA output replica and the PA output copy may be variable with respect to each other, and with respect to incoming received signals. The poly-phase, multi-tone and amplitude variable aspects of the PA output replica and the PA output copy may be implemented in analog, digital or a combination of both analog and digital portions of a near-field communication (NFC) block.

The operational mode may be a reader mode with target load modulation. Performing the operational mode may include transmitting an outgoing carrier. An incoming load modulation of the outgoing carrier may be sensed by providing the PA output replica to the signal combining block. The outgoing carrier may be stripped at the signal combining block with the PA output copy to isolate an incoming load modulation signal and carrier residue.

The operational mode may be a target mode. A low level outgoing carrier may be transmitted to maintain a controlled output impedance connection at a matching network and antenna. An incoming modulation of an incoming carrier may be sensed by providing the PA output replica to the signal combining block. The outgoing carrier and incoming carrier may be stripped at the signal combining block with the PA output copy with a weighted output level to isolate an incoming modulation signal.

The method may also include performing a phase lock on an incoming carrier based on a summing error generated by summing the PA output replica and the PA output copy at the signal combining block.

The operational mode may be a target mode with active load modulation (ALM). An outgoing ALM sub-carrier may be transmitted. The outgoing ALM sub-carrier and incoming modulation of an incoming carrier may be sensed by providing the PA output replica to the signal combining block. The outgoing ALM sub-carrier and the incoming carrier may be stripped at the signal combining block with the PA output copy to isolate an incoming modulation signal on the incoming carrier.

The operational mode may be a radio frequency (RF) polling mode. An outgoing polling signal may be transmitted. The outgoing polling signal and channel effects may be sensed by providing the PA output replica to the signal combining block. Signal levels for the channel effects may be determined by subtracting the PA output copy from the PA output replica at the signal combining block. The presence of a coupled object may be determined based on a change in the signal levels.

The operational mode may be an RF polling mode. The signal combining block may include a receiver analog-to-digital converter (ADC). An outgoing polling signal may be transmitted. The outgoing polling signal and channel effects may be sensed by providing the PA output replica to an input of the receiver ADC. Signal levels for the channel effects may be determined by providing the PA output copy at higher order frequencies to a clock of the receiver ADC. The presence of a coupled object may be determined based on a change in the signal levels.

The operational mode is an RF polling mode. The signal combining block may include a receiver ADC. An outgoing polling signal may be transmitted. The outgoing polling signal and channel effects may be sensed by providing the PA output replica to an input of the receiver ADC. Signal levels for the channel effects may be determined by providing the PA output copy that is at or near frequencies of the transmitted polling signal to a clock of the receiver ADC. The presence of a coupled object may be determined based on a change in resulting directly down-converted signal levels.

A wireless communication device for inductively coupled communication is also described. The wireless communication device includes a processor, a memory in communication with the processor, and instructions stored in the memory. The instructions are executable by the processor to determine an operational mode for inductively coupled communication. The instructions are also executable to perform the operational mode by combining a transmit PA output replica and a PA output copy at a signal combining block of a receiver. The PA output replica reflects effects of channel properties. The PA output copy is unaffected by the channel properties.

An apparatus for inductively coupled communication is also described. The apparatus includes means for determining an operational mode for inductively coupled communication. The apparatus also includes means for performing the operational mode by combining a transmit PA output replica and a PA output copy at a signal combining block of a receiver. The PA output replica reflects effects of channel properties. The PA output copy is unaffected by the channel properties.

A computer-program product for inductively coupled communication is also described. The computer-program product includes a non-transitory computer-readable medium having instructions thereon. The instructions include code for causing a wireless communication device to determine an operational mode for inductively coupled communication. The instructions also include code for causing the wireless communication device to perform the operational mode by combining a transmit PA output replica and a PA output copy at a signal combining block of a receiver. The PA output replica reflects effects of channel properties. The PA output copy is unaffected by the channel properties.

DETAILED DESCRIPTION

The detailed description set forth below in connection with the appended drawings is intended as a description of exemplary implementations of the disclosure and is not intended to represent the only implementations in which the disclosure may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations of the disclosure. In some instances, some devices are shown in block diagram form.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

Figure 1:
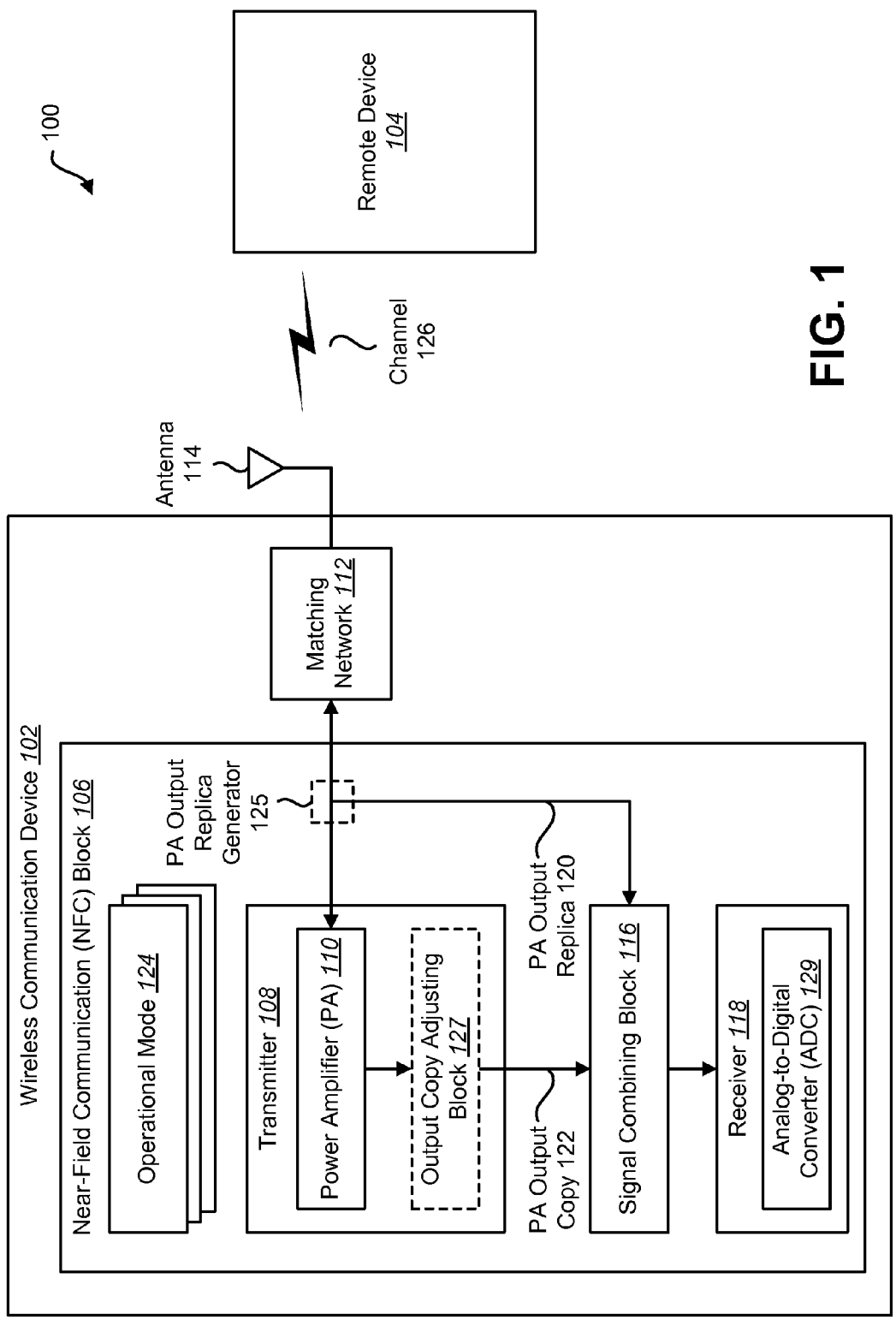
FIG. 1 is a block diagram illustrating one configuration of a wireless communication system for performing inductively coupled communication.

FIG. 1 is a block diagram illustrating one configuration of a wireless communication system 100 for performing inductively coupled communication. The wireless communication system 100 may include a wireless communication device 102 that is in communication with a remote device 104. In one configuration, the wireless communication device 102 and the remote device 104 may communicate using inductively coupled communication.

The wireless communication device 102 may also be referred to as an electronic communication device, mobile device, mobile station, subscriber station, client, client station, user equipment (UE), remote station, access terminal, mobile terminal, terminal, user terminal, subscriber unit, etc. Examples of wireless communication devices include laptop or desktop computers, cellular phones, smart phones, wireless modems, e-readers, tablet devices, gaming systems, etc. Some of these devices may operate in accordance with one or more industry standards.

In an implementation of inductively coupled communication, the wireless communication device 102 and the remote device 104 may use near-field communication (NFC). In the context of near-field communications, there are two devices communicating: a reader and a target. The wireless communication device 102 may operate as a reader NFC device or as a target NFC device depending on an operational mode 124. A reader NFC device may also be referred to as a poller, polling device, or initiator. A target NFC device may also be referred to as a listener, listening device, or tag. When operating as a reader, the antenna 114 of the wireless communication device 102 may produce a radiated field (also referred to as a magnetic field or an electromagnetic field). This radiated field may be received by the antenna of a remote device 104 that is operating as a target NFC device.

The wireless communication device 102 and the remote device 104 may use one or more NFC signaling technologies to communicate with each other. The NFC signaling technologies may include NFC type-A, NFC type-B and NFC type-F. The NFC signaling technologies differ in the modulation schemes employed.

NFC has four different tag types, which support a subset of the NFC signaling technologies. Type 1 tags (T1T) use NFC type-A communication without data collision protection. Type 2 tags (T2T) use NFC type-B communication with anti-collision. Type 3 tags (T3T) use NFC type-F with anti-collision. Type 4 tags (T4T) can use either NFC type-A (T4AT) or NFC type-B (T4BT) with anti-collision.

In a configuration, the wireless communication device 102 and the remote device 104 may be operable to communicate using NFC through various interfaces, such as a frame RF interface, ISO-data exchange protocol (DEP) RF interface and NFC-DEP RF interface. In another configuration, the wireless communication device 102 and the remote device 104 may establish an NFC-DEP RF protocol-based communication link with link layer connections defined through a logical link control protocol (LLCP). In still another configuration, the wireless communication device 102 and the remote device 104 may be operable to be connected to an access network and/or core network (e.g., a CDMA network, a GPRS network, a UMTS network, and other types of wireline and wireless communication networks).

In another operational mode 124, the wireless communication device 102 may poll for nearby NFC devices. The remote device 104 may begin to listen when it comes within a few centimeters of the wireless communication device 102. The wireless communication device 102 will then communicate with the remote device 104 to determine which signaling technologies can be used. For example, when the wireless communication device 102 is acting as a reader, the remote device 104 may enter the radiated field of the wireless communication device 102.

When in reader mode, the wireless communication device 102 may generate an RF field to communicate with the remote device 104. The wireless communication device 102 may modulate the RF field to send a signal (e.g., data) to the remote device 104. Once the remote device 104 receives that signal, the wireless communication device 102 may transmit a continuous wave to maintain the RF field. The continuous wave may have a carrier frequency. In the case of NFC, the carrier frequency may be 13.56 megahertz (MHz). The remote device 104 may receive the RF field. The remote device 104 may respond by performing modulation on top of the continuous wave. The wireless communication device 102 may receive the modulated signal and try to decode it.

NFC hardware system architectures may perform one or more of the operational modes 124. These operational modes 124 are discrete functional activities. For example, NFC systems may perform activities related to a reader/writer (e.g., reader) and card emulation (e.g., target), as described above.

In an approach, these operational modes 124 lead to an architecture with discrete blocks, the blocks including circuits to perform the different operational modes 124. For example, one block may be dedicated to RF polling operations (e.g., sniffing or target detection). Another block may be dedicated to reader transmit and receive operations. And another block may be dedicated to target transmit (of either passive or active load modulation) and target receive operations.

Each of the discrete blocks may include one or more pins for integration into an NFC chip. However, the allocation of specific blocks and package pins to deal with specific tasks can be expensive, inefficient and time consuming to implement and integrate.

The systems and methods herein describe the use of an NFC transmit power amplifier (PA) output replica 120 and a PA output copy 122 in combination with a receiver signal combining block 116 to perform multiple operational modes 124. This may allow for multiple NFC functional activities (i.e., operational modes 124) to be undertaken by the same NFC block 106 instead of implementing dedicated designs for each operational mode 124.

The wireless communication device 102 may include an NFC block 106 that performs NFC operations. For example, the NFC block 106 may establish a communication channel 126 between the wireless communication device 102 and a remote device 104 using NFC protocols. The NFC block 106 may also be referred to as an NFC controller (NFCC), an NFC chip or a module on a system-on-chip (SoC). The NFC block 106 may include a transmitter 108 and a receiver 118.

The PA output replica 120 reflects the external output voltage and currents of the PA 110, and can therefore replicate the effects of channel properties. These channel properties may include loading conditions in relation to at least one of the antenna 114, matching network 112, coupling to a remote device 104 or any load modulation conditions.

In an implementation, the NFC block 106 may (optionally) include a PA output replica generator 125 that generates the PA output replica 120. The PA output replica generator 125 may be coupled between the PA 110 and the matching network 112 (as shown) or may be integrated within the PA 110. In an approach, the PA output replica generator 125 may be a circuit-level current/voltage mirror circuit that faithfully replicates a ratio of the PA output stage currents and voltages. In another approach, the PA output replica generator 125 may be current and voltage sensing transformers. In another approach, the PA output replica generator 125 may be a tap from an electromagnetic interference (EMI) filter (e.g., ISM filter). In yet another approach, the PA output replica generator 125 may be a coupler that measures reflected power waves and incident power waves instead of voltages and currents. The generation of the PA output replica 120 is described in more detail in connection with FIG. 3.

The PA output copy 122 may be a scaled transmit signal copy. The PA output copy 122 is unaffected by the channel properties such as the effects of loading conditions due to the antenna 114, matching network 112, coupling to a remote device 104 and load modulation conditions.

It should be noted that the same source signal may be used to generate the PA output replica 120 and the PA output copy 122. However, the NFC block 106 may independently change the phase and amplitude of the PA output copy 122 with respect to the PA output replica 120. Thus, in one example, a separate digital-to-analog converter (DAC) may generate and scale the PA output copy 122.

In an implementation, the signal combining block 116 may include a summer that performs receiver block summing (also referred to as receiver summing). In this implementation, the signal combining block 116 may perform time domain summing of the PA output replica 120 and the PA output copy 122. The PA output copy 122 may be subtracted from the PA output replica 120 to leave only the incoming signal (e.g., modulated signal) and carrier residue. This implementation may be configured for cancellation and carrier correlation.

In another implementation, the signal combining block 116 may include a mixer. In this implementation, the mixer may perform frequency translation using the PA output replica 120 and the PA output copy 122. For example, the PA output replica 120 may be multiplied by the negative of PA output copy 122. The remaining signal may be at the carrier frequency. This remaining signal may be mixed down in the receiver 118 using the PA output copy 122 again to get the signal down to DC. The receiver 118 may then reject the DC to leave only the incoming signal (e.g., modulated signal) and carrier residue.

In yet another implementation, the signal combining block 116 may include an analog-to-digital converter (ADC) 129 of the receiver 118. In this implementation, the PA output replica 120 may be provided to an input of the receiver ADC 129. The PA output copy 122 may be provided to the clock of the receiver ADC 129. The resulting output of the ADC 129 may be used for RF polling, as described below.

It should be noted that while the signal combining block 116 is shown outside the receiver 118 in FIG. 1, the signal combining block 116 may also be included within the receiver 118. Furthermore, down-conversion (either direct or intermediate frequency (IF)) and digitization may be done in the receiver 118.

The PA output replica 120 may be coupled to the external matching network 112 and the antenna 114. The PA output replica 120 may also be coupled to the signal combining block 116. The PA output copy 122 may be coupled to the signal combining block 116. The PA output replica 120 and PA output copy 122 may be internally routed to the receiver path, eliminating the need for external receiver package pins and associated external components.

The NFC block 106 may perform multiple operational modes 124 using the PA output replica 120, the PA output copy 122 and the signal combining block 116. One operational mode 124 may include a reader mode in which the wireless communication device 102 operates as reader. Another operational mode 124 may include a target mode in which the wireless communication device 102 operates as a target. Yet another operational mode 124 may include an RF polling mode in which the wireless communication device 102 may poll for nearby NFC devices.

In one case, the operational mode 124 of the wireless communication device 102 may be reader mode with target passive load modulation. In this operational mode 124, the wireless communication device 102 is acting as a reader and the remote device 104 is the target. The wireless communication device 102 may send an outgoing carrier to the remote device 104. For instance, the PA 110 of the transmitter 108 may send the carrier to the matching network 112 and antenna 114 for transmission to the remote device 104.

The remote device 104 may receive the outgoing carrier and respond by performing passive load modulation on the carrier. The PA output replica 120, which includes the incoming load modulation of the outgoing carrier, may be fed to the signal combining block 116. In this way, the wireless communication device 102 may sense incoming load modulation of the outgoing carrier when in reader mode with target passive load modulation.

The PA output copy 122 may be fed to the signal combining block 116 to strip the outgoing carrier to leave just the incoming load modulation signal and carrier residue. As used herein, the term "strip" or "stripping" refers to cancellation of a signal. Therefore, in this case, the signal combining block 116 may perform cancellation of the outgoing carrier. This may be accomplished by subtracting the PA output copy 122 from the PA output replica 120. The resulting load modulation signal may be further processed by the receiver 118.

In another case, the operational mode 124 of the wireless communication device 102 may be reader mode with incoming target active load modulation (ALM). In this operational mode 124, the wireless communication device 102 is acting as a reader and the remote device 104 is the target.

To compensate for the deficiencies of passive load modulation, a target device may use active load modulation (ALM). With ALM, alternate circuit approaches are based on synchronizing the target device to the signal from the reader device. The target device may regenerate the signal received from the reader device. The target device may then retransmit a phase-synchronized modulated signal to the reader device. With ALM, the resulting level of the modulation received at the reader device can be higher than the modulation level produced by a traditional passive (e.g., resistive) load modulation.

When operating in reader mode with incoming target ALM, the wireless communication device 102 may send an outgoing carrier to the remote device 104 as described above. The remote device 104 may then perform ALM on the carrier.

The PA output replica 120 may be fed to the signal combining block 116 for sensing the incoming active load modulation of the outgoing carrier. The PA output copy 122 is fed to the signal combining block 116 to strip the outgoing carrier to leave just the incoming active load modulation signal and carrier residue. The resulting modulation signal may be further processed by the receiver 118.

In another case, the operational mode 124 of the wireless communication device 102 may be target mode. In this operational mode 124, the wireless communication device 102 is acting as the target and the remote device 104 is the reader. The wireless communication device 102 may then receive a modulated signal from the remote device 104.

A very low level or no carrier level may be transmitted by the PA 110 to the external outputs connecting the NFC block 106 to the matching network 112. For example, in an implementation where the NFC block 106 is connected to the matching network 112 using one or more package pins, the PA 110 may transmit a low level or no carrier level across the pins to the matching network 112. This maintains a controlled output impedance connection to the matching network 112 and antenna 114. Leaving this circuit disconnected and at a higher impedance may lead to an un-damped response and high induced voltage levels at the package pins of the NFC chip, possibly damaging the circuits. Therefore, transmitting a low level (or no level) carrier may maintain a controlled output impedance and prevent this damage condition.

The PA output replica 120 may be fed to the signal combining block 116 for sensing the modulation of an incoming carrier from an external reader (e.g., remote device 104). In an implementation, the PA output copy 122 with weighted output level may be fed to the signal combining block 116 that aligns with the incoming carrier (from the external reader) to leave just the incoming modulation signal and carrier residue. The resulting modulation signal may be further processed by the receiver 118.

The transmitter 108 may optionally include an output copy adjusting block 127 that may generate a weighted output level. A weighted output level (also referred to as a weighted copy level) may be used to ensure that the wireless communication device 102 minimizes the effect of the PA output copy 122 at the output of the signal combining block 116. The level of the PA output replica 120 may change as the PA 110 adjusts its gain to compensate for changes in the impedance of the matching network 112 and/or antenna 114 due to the channel effects. For example, as the impedance of the matching network 112 and/or antenna 114 changes due to load modulation or coupling with the remote device 104, the current of the PA output replica 120 may change. Therefore, the level of the PA output replica 120 may differ from the level of the PA output copy 122, which does not experience the channel effects.

However, subtracting too little or too much from the PA output replica 120 may result in the carrier residue being too large with respect to the desired modulated signal. The output copy adjusting block 127 may adjust the level of the PA output copy 122 to minimize the difference with the PA output replica 120 level.

The wireless communication device 102 may perform a phase lock on the incoming carrier. The incoming carrier phase, frequency and amplitude alignment may be estimated by processing the summing error. In an implementation, this may be accomplished using a phase/frequency and amplitude locked loop. The more the wireless communication device 102 achieves alignment of the phase/frequency with the amplitude, the less error is seen at the output. An adaptive algorithm may adjust the frequency, phase and amplitude parameters to minimize the error. To retain a reference clock derived from the external reader (i.e., remote device 104), carrier alignment is the desired objective rather than cancellation of incoming carrier signal.

In yet another case, the operational mode 124 of the wireless communication device 102 may be target mode with active load modulation (ALM). In this operational mode 124, the wireless communication device 102 is acting as the target and the remote device 104 is the reader. The wireless communication device 102 may receive a modulated signal from the remote device 104. The wireless communication device 102 may also perform ALM with the remote device 104.

In this operational mode 124, a transmitted ALM sub-carrier is sent by the PA 110. Again, the NFC block 106 maintains a controlled output impedance connection to the matching network 112 and antenna 114, as opposed to leaving the circuit disconnected and at a higher impedance leading to un-damped responses and high induced voltage levels at the chip package pins that can damage the circuits.

The PA output replica 120 is fed to the signal combining block 116 for sensing the transmitted ALM and modulation of an incoming carrier from the remote device 104. The PA output copy 122 is fed to the signal combining block 116 to strip the outgoing ALM sub-carrier and the incoming carrier to leave just the modulated signal on the incoming carrier from the remote device 104.

Phase lock on the incoming carrier may be performed as described above. However, to retain a reference clock derived from the remote device 104, cancellation of the outgoing ALM sub-carrier signal is desired.

In yet another case, the operational mode 124 of the wireless communication device 102 may be RF Polling mode. In this operational mode 124, the wireless communication device 102 may poll for an external device (e.g., remote device 104). The PA 110 may transmit an outgoing polling signal. The polling signal may be a low level carrier frequency sweep, multitone or wide-band (e.g., pulse, pseudo random binary sequence (PRBS), etc.) signal transmitted by the PA 110.

The wireless communication device 102 may sense the outgoing polling signal and channel effects. The PA output replica 120 may be provided to the signal combining block 116 and may contain the transmitted polling signal and effects from properties of the output channel 126. For example, if the remote device 104 enters the vicinity of the wireless communication device 102, then the channel properties may change due to coupling between the wireless communication device 102 and the remote device 104. Signal levels for the channel effects may be determined by subtracting at the signal combining block 116 the PA output copy 122 from the PA output replica 120.

The wireless communication device 102 may determine the presence of a coupled object (e.g., remote device 104) based on a change in the signal levels. As the remote device 104 comes closer to the wireless communication device 102, then the difference between the PA output replica 120 and the PA output copy 122 may increase, indicating the presence of a coupled object.

In an implementation, the signal combining block 116 may not perform down-conversion during RF polling. In this implementation, the signal produced by the signal combining block 116 is a subtraction of the PA output replica 120 and the PA output copy 122. In this case, the signal combining block 116 may be a block that performs time domain summing of the PA output replica 120 and the PA output copy 122. The result will vary over the frequency band according to the channel properties. Down-conversion of this signal could happen later in the receiver 118.

In another implementation, the full or partial receiver chain or just an analog-to-digital converter (ADC) 129 can be used to digitize the PA output replica 120. In this implementation, the signal combining block 116 may be an ADC 129 of the receiver 118. The wireless communication device 102 may sense the outgoing polling signal and channel effects by providing the PA output replica 120 to an input of the receiver ADC 129.

In this implementation, the PA output replica 120 may be the input frequency of the ADC 129. The PA output copy 122 may be used as a variable or multiplied clock frequency for the ADC 129. The ADC 129 clock can be swept on or near to the same frequency as those in the transmitted polling signal, or swept at a multiple of the channel frequency to be analyzed, to digitize the entire channel bandwidth. Corresponding digital codes (e.g., DC codes) are therefore produced that capture the effects of the channel 126 on the frequencies within the channel bandwidth. If the input frequency and the clock frequency are the same at the ADC 129, this mixes the frequency down to DC due to sampling the same voltage each time.

If the environment changes due to the presence of a remote device 104, a resonance peak may move, this resonance peak movement due to a coupled object may be referred to as a coupled object artifact. This resonance peak movement may occur in terms of frequency polling or in terms of amplitude. If the resonance peak changes, then the digital code will change. The wireless communication device 102 may look at the digital codes to detect this movement. The movement of the digital codes may indicate the presence of the remote device 104.

The effect on the resonance of the antenna 114 and matching network 112 and the resonance due to coupled objects (e.g., remote device 104) in the vicinity of the wireless communication device 102 may be digitally recorded over the frequency range of the channel 126. If a change occurs in the environment in relation to coupled objects, there will be a corresponding change in the resonance of the antenna/matching network and the resonance of the coupled object. In other words, there may be a shift (e.g., movement) of coupled object artifacts. This will be reflected in a change of digital codes at the corresponding frequencies of the channel 126.

In an approach, the wireless communication device 102 may determine signal levels for the channel effects by using the PA output copy 122 at higher order frequencies as the clock of the receiver ADC 129. In another approach, the wireless communication device 102 may determine the presence of a coupled object based on a change in the resulting directly down-converted signal levels. Down-conversion (e.g., to DC) here may be done directly by the ADC 129 by correlating the ADC 129 clock and input signal. In this approach, the wireless communication device 102 may determine signal levels for the channel effects by using the PA output copy 122 that is at or near to the same frequencies as those in the transmitted polling signal (i.e., PA output replica 120) as the clock of the receiver ADC 129. As described above, the changes in resonance due to a coupled object may be detected in changes to the digital codes generated by the ADC 129. These digital codes may be used to determine signal levels for the channel effects.

The PA output replica 120 and PA output copy 122 signals have many possibilities for phase, frequency and amplitude alignments. These may be varied with respect to each other, and with respect to incoming received signals. The polyphase, multi-tone and amplitude variable alignments may be implemented in analog, digital or a combination of both analog and digital portions of the NFC block 106.

The described systems and methods will result in NFC-based communications utilizing fewer hardware components. Instead of discrete blocks for the various NFC functional activities (e.g., reader, target, polling, etc.), the NFC block 106 may realize different operational modes 124 using a single transmitter 108 and receiver 118 to implement different NFC functions. A desired result is to reduce the number of blocks and package pins in the NFC block 106, which further may reduce the size and cost of the NFC block 106.

Figure 2:
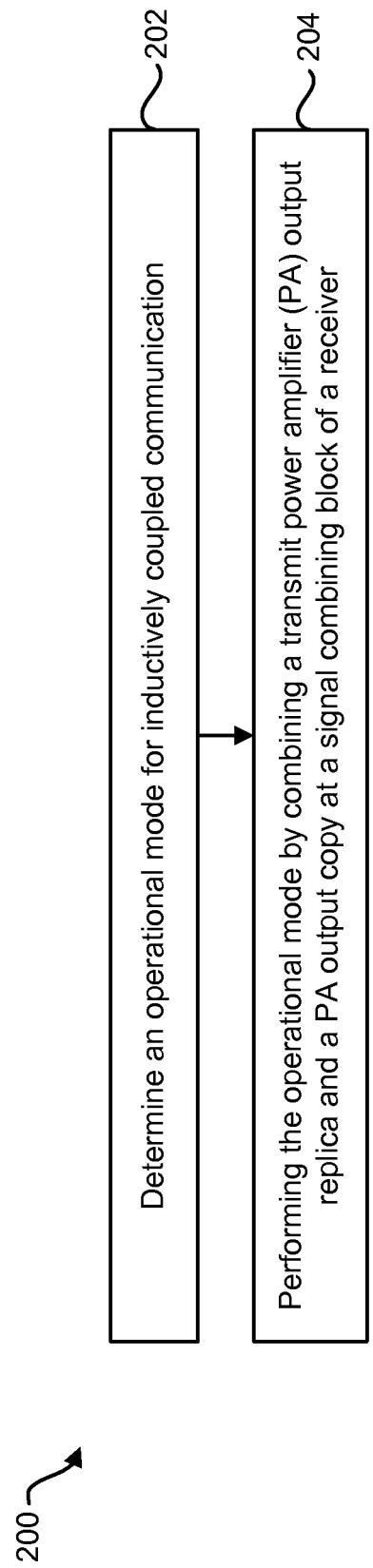
FIG. 2 is a flow diagram illustrating a method for multi-mode inductively coupled communication.

FIG. 2 is a flow diagram illustrating a method 200 for multi-mode inductively coupled communication. The method 200 may be performed by a wireless communication device 102. The wireless communication device 102 may be configured with NFC circuitry for communication with a remote device 104. The NFC circuitry may include an NFC block 106 and NFC antenna circuitry (e.g., an NFC antenna 114 and matching network 112).

The wireless communication device 102 may determine 202 an operational mode 124 for inductively coupled communication. The wireless communication device 102 may perform inductively coupled communication using NFC. The wireless communication device 102 may determine whether to operate in a reader mode, a target mode or an RF polling mode. The operational mode 124 may be selected based on one or more applications running on the wireless communication device 102.

The wireless communication device 102 may perform 204 the operational mode 124 by combining a transmit power amplifier (PA) output replica 120 and a PA output copy 122 at a signal combining block 116 of a receiver 118. The PA output replica 120 may reflect effects of channel properties. The channel properties may include loading conditions in relation to at least one of the antenna 114, matching network 112, coupling to a remote device 104, or load modulation. The PA output copy 122 may be unaffected by the channel properties.

In an implementation, the signal combining block 116 may include a summer that performs time domain summing of the PA output replica 120 and the PA output copy 122. The PA output copy 122 may be subtracted from the PA output replica 120. This implementation may be configured for cancellation and carrier correlation.

In another implementation, the signal combining block 116 may include a mixer. The mixer may perform frequency translation using the PA output replica 120 and the PA output copy 122.

In yet another implementation, the signal combining block 116 may be an analog-to-digital converter (ADC) 129 of the receiver 118 that can be used to digitize the PA output replica 120. In this implementation, the PA output replica 120 may be provided to an input of the receiver ADC 129. The PA output copy 122 may be provided to the clock of the receiver ADC 129.

The wireless communication device 102 may perform a reader mode with target load modulation as described in connection with FIG. 5. A target mode may be performed as described in connection with FIG. 6. A target mode with active load modulation (ALM) may be performed as described in connection with FIG. 7. An RF polling mode may be performed as described in connection with FIGS. 8-10.

Figure 3:
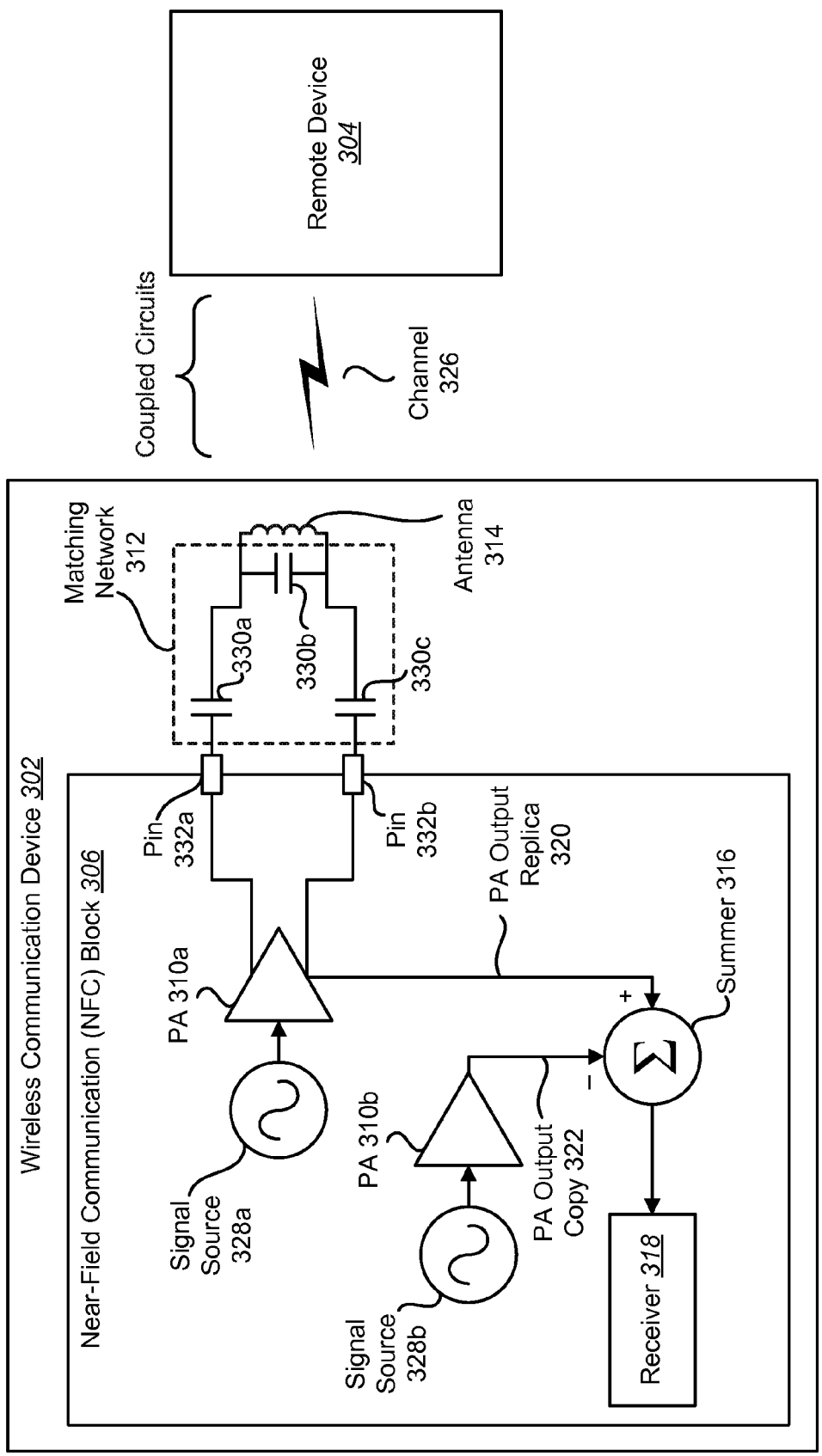
FIG. 3 is a block diagram illustrating one example of a wireless communication device for multi-mode near-field communication (NFC)

FIG. 3 is a block diagram illustrating one example of a wireless communication device 302 for multi-mode NFC. The wireless communication device 302 may include an NFC block 306 for performing NFC operations with a remote device 304. For example, the NFC block 306 may establish a communication channel 326 between the wireless communication device 302 and a remote device 304 using NFC protocols.

The NFC block 306 may include a transmit power amplifier (PA) 310a and a receiver 318. The PA 310a may receive a signal from a signal source 328a. The PA 310a may be coupled to a matching network 312 via two pins 332a,b. In an implementation, the matching network 312 may include three capacitors 330a-c. The matching network 312 may be coupled to an antenna 314. In an implementation, the antenna 314 may be a coil or loop antenna.

The NFC block 306 may generate a PA output replica 320 that reflects the external output voltage and currents of the PA 310. Therefore, the PA output replica 320 may replicate the effects of channel properties. These channel properties may include loading conditions in relation to at least one of the antenna 314, matching network 312, coupling to a remote device 304 and all load modulation conditions.

In an implementation, the PA output replica 320 may be generated using a circuit-level current/voltage mirror circuit that faithfully replicates a ratio of the PA output stage currents and voltages. In another implementation, the PA output replica 320 may be generated with current and voltage sensing transformers. The current and voltage sensing transformers may be part of an EMI filter. In yet another implementation, the PA output replica 320 may be generated with a coupler that measures reflected power waves (a) and incident power waves (b) instead of voltages and currents. The PA 310 voltage v is related to a and b as $v=k(a+b)$, where k is a fixed constant related to the reference impedance for the coupler.

The NFC block 306 may generate a PA output copy 322 that is a scaled transmit signal copy. The PA output copy 322 is unaffected by the channel properties such as the effects of loading conditions due to the antenna 314, matching network 312, coupling to a remote device 304 and load modulation conditions. The PA output copy 322 may be a dummy transmit PA signal that is unloaded by the outside circuit. Since the PA output copy 322 does not need to be full size, the signal (voltage/current) amplitude may be scaled by adjusting the voltage/current ratios.

It should be noted that the same signal source 328 and PA 310 may be used to generate the PA output replica 320 and the PA output copy 322. However, the NFC block 306 may independently change the phase and amplitude of the PA output copy 322 with respect to the PA output replica 320. Thus, in one example, a separate digital-to-analog converter (DAC) may generate and scale the PA output copy 322. Therefore, a separate signal source 328b and PA 310b are depicted in FIG. 3 for generating the PA output copy 322.

The PA output replica 320 and the PA output copy 322 may be provided to a summer 316. The summer 316 may be an implementation of the signal combining block 116 of FIG. 1. The summer 316 may perform time domain summing of the PA output replica 320 and the PA output copy 322. The PA output copy 322 may be subtracted from the PA output replica 320. The output of the summer 316 may be provided to the receiver 318. Down-conversion (either direct or intermediate frequency (IF)) and digitization may be done in the receiver 318.

This implementation may be configured for cancellation and carrier correlation. Because the PA output replica 320 and PA output copy 322 are internally routed to the receiver path, this eliminates the need for external receiver package pins and associated external components.

Figure 4:
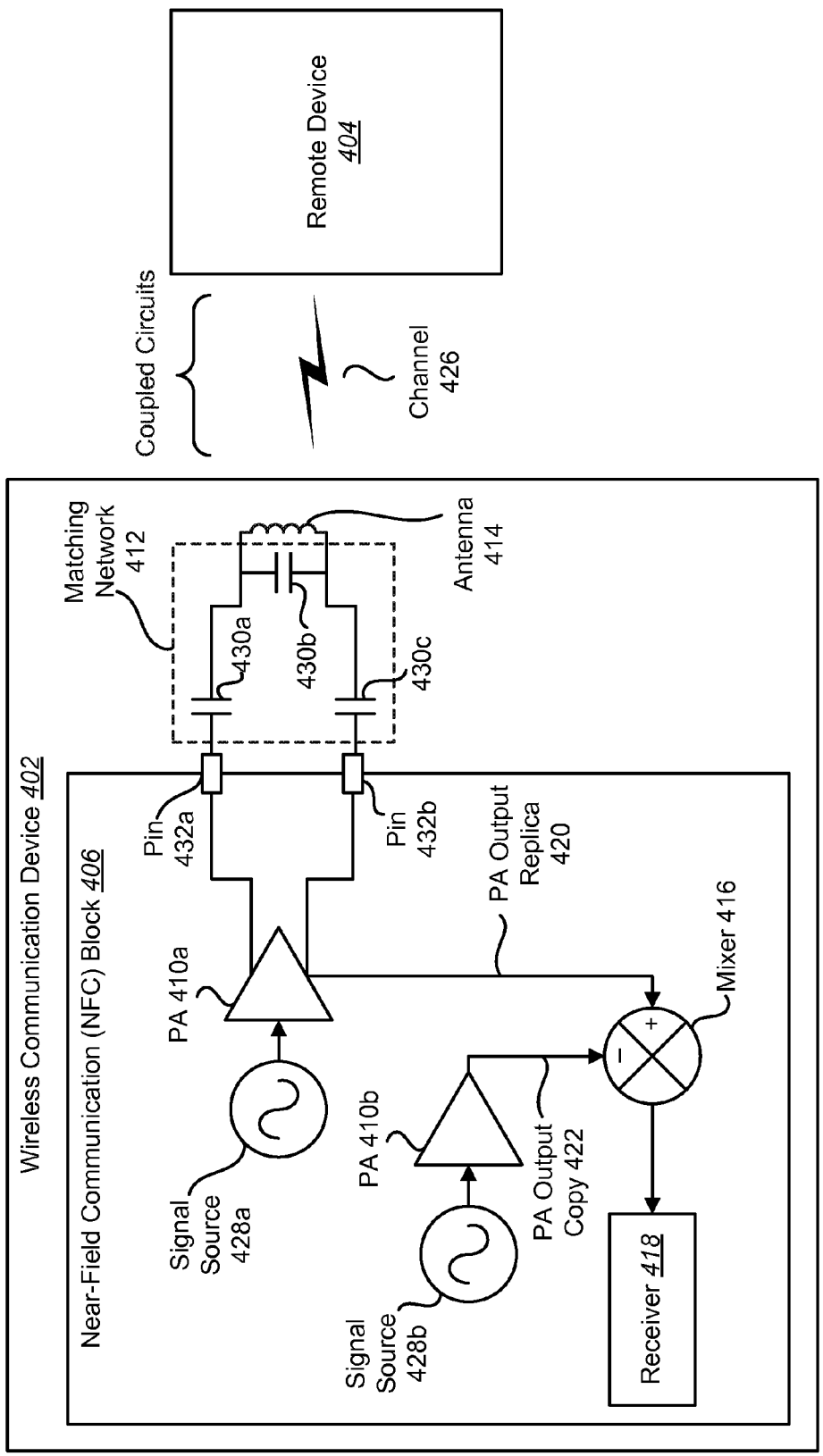
FIG. 4 is a block diagram illustrating another example of a wireless communication device for multi-mode NFC.

FIG. 4 is a block diagram illustrating another example of a wireless communication device 402 for multi-mode NFC. The wireless communication device 402 may include an NFC block 406 for performing NFC operations with a remote device 404. For example, the NFC block 406 may establish a communication channel 426 between the wireless communication device 402 and a remote device 404 using NFC protocols.

The NFC block 406 may include a signal source 428a, PA 410a and a receiver 418. The PA 410a may be coupled to a matching network 412 via two pins 432a,b. In an implementation, the matching network 412 may include three capacitors 430a-c. The matching network 412 may be coupled to an antenna 414.

The NFC block 406 may generate a PA output replica 420 and PA output copy 422 as described in connection with FIG. 3. As described above, the NFC block 406 may independently change the phase and amplitude of the PA output copy 422 with respect to the PA output replica 420. Therefore, a separate signal source 428b and PA 410b are depicted in FIG. 4 for generating the PA output copy 422. However, the same signal source 428 and PA 410 may be used to generate the PA output replica 420 and the PA output copy 422.

In this implementation, the NFC block 406 may include a mixer 416. The PA output replica 420 and the PA output copy 422 may be provided to the mixer 416. The mixer 416 may be an implementation of the signal combining block 116 of FIG. 1. The mixer 416 may perform frequency translation of the PA output replica 420 and the PA output copy 422. The output of the mixer 416 may be provided to the receiver 418. The output of the mixer 416 may be mapped to DC. The receiver 418 may perform digitization and reject the DC component from the mixer output signal.

Figure 5:
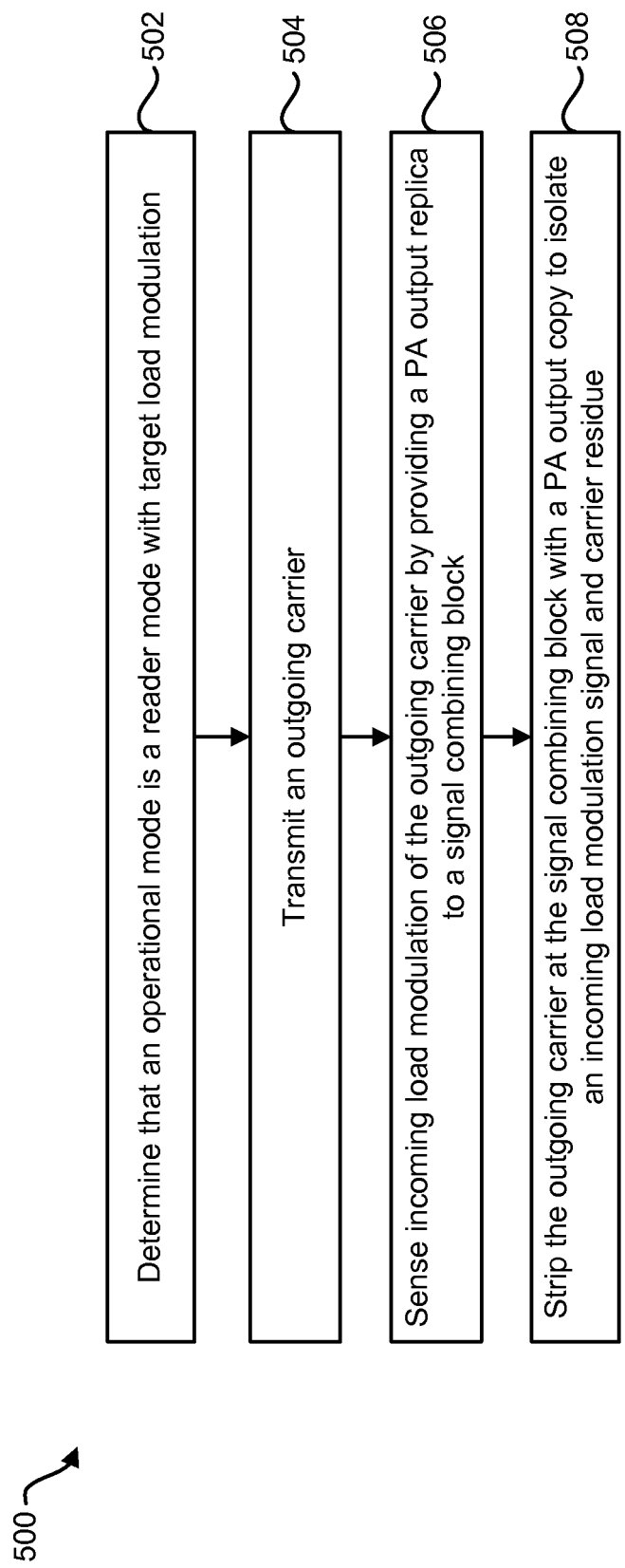
FIG. 5 is a flow diagram illustrating a method for performing a reader mode with target load modulation.

FIG. 5 is a flow diagram illustrating a method 500 for performing a reader mode with target load modulation. The method 500 may be implemented by a wireless communication device 102. The wireless communication device 102 may be configured with an NFC block 106 for communication with a remote device 104. The NFC block 106 may perform multiple operational modes 124 using a PA output replica 120, a PA output copy 122 and a signal combining block 116.

The wireless communication device 102 may determine 502 that the operational mode 124 for NFC is reader mode with target passive load modulation. In this operational mode 124, the wireless communication device 102 is acting as a reader and the remote device 104 is the target.

The wireless communication device 102 may transmit 504 an outgoing carrier. The wireless communication device 102 may send the outgoing carrier to the remote device 104. For instance, the PA 110 of the transmitter 108 may send the carrier to the matching network 112 and antenna 114 for transmission to the remote device 104.

The wireless communication device 102 may sense 506 incoming load modulation of the outgoing carrier by providing the PA output replica 120 to the signal combining block 116. The remote device 104 may receive the outgoing carrier and respond by performing passive load modulation on the carrier. The PA output replica 120, which includes the incoming load modulation of the outgoing carrier, may be fed to the signal combining block 116. In this way, the wireless communication device 102 may sense incoming load modulation of the outgoing carrier.

The wireless communication device 102 may strip 508 the outgoing carrier at the signal combining block 116 with the PA output copy 122 to isolate the incoming load modulation signal and carrier residue. For example, the signal combining block 116 may perform cancellation of the outgoing carrier. This may be accomplished by subtracting the PA output copy 122 from the PA output replica 120. The resulting load modulation signal may be further processed by the receiver 118.

In the case where the remote device 104 performs active load modulation (ALM), the PA output replica 120 may be fed to the signal combining block 116 for sensing the incoming active load modulation of the outgoing carrier. The PA output copy 122 may be fed to the signal combining block 116 to strip the outgoing carrier to leave just the incoming active load modulation signal and carrier residue.

Figure 6:
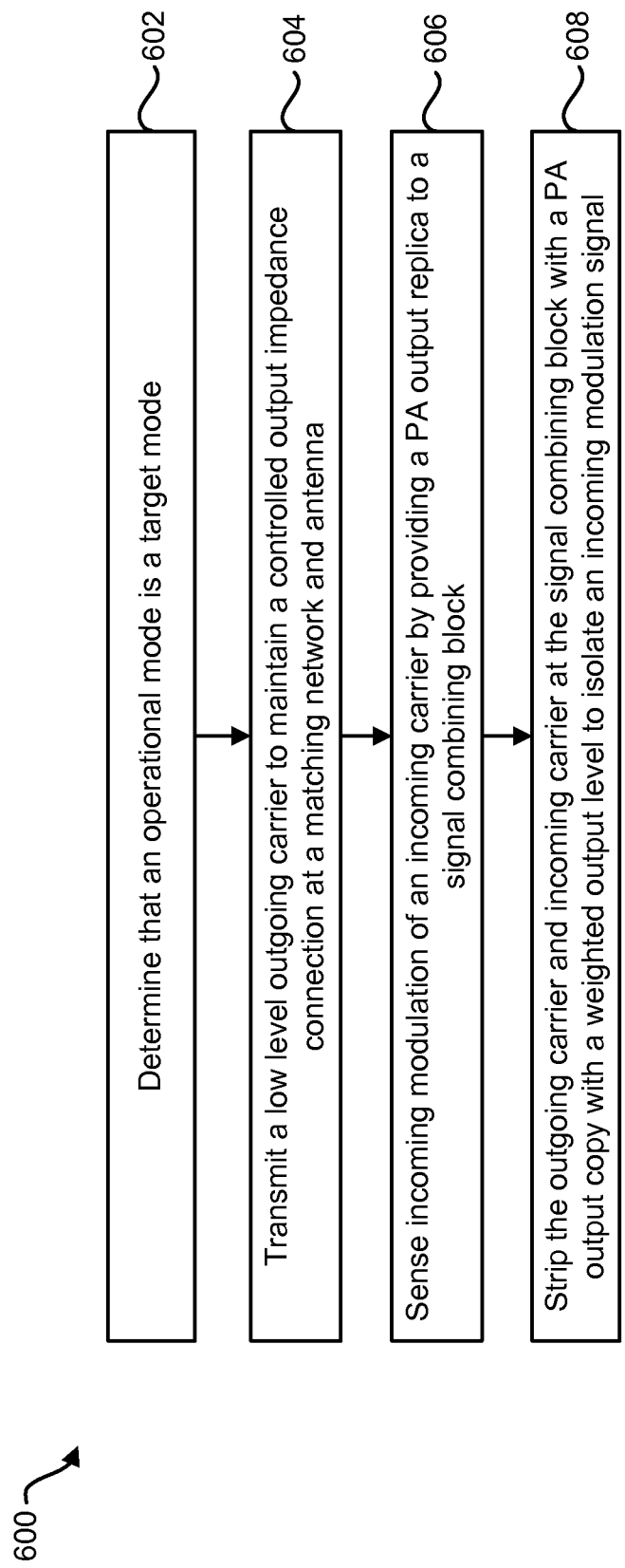
FIG. 6 is a flow diagram illustrating a method for performing a target mode.

FIG. 6 is a flow diagram illustrating a method 600 for performing a target mode. The method 600 may be implemented by a wireless communication device 102. The wireless communication device 102 may be configured with an NFC block 106 for communication with a remote device 104. The NFC block 106 may perform multiple operational modes 124 using a PA output replica 120, a PA output copy 122 and a signal combining block 116.

The wireless communication device 102 may determine 602 that the NFC operational mode 124 is target mode. In this operational mode 124, the wireless communication device 102 is acting as the target and the remote device 104 is the reader. The wireless communication device 102 may receive a modulated signal from the remote device 104.

The wireless communication device 102 may transmit 604 a low level outgoing carrier to maintain a controlled output impedance connection at the matching network 112 and antenna 114. This maintains a controlled output impedance connection to the matching network 112 and antenna 114.

The wireless communication device 102 may sense 606 incoming modulation of an incoming carrier by providing the PA output replica 120 to the signal combining block 116. The PA output replica 120 may be fed to the signal combining block 116 for sensing the incoming modulation of an incoming carrier from an external reader (e.g., remote device 104).

The wireless communication device 102 may strip 608 the outgoing carrier and incoming carrier at the signal combining block 116 with the PA output copy 122 with a weighted output level to isolate the incoming modulation signal from the remote device 104. For example, the signal combining block 116 may subtract the PA output copy 122 with a weighted output level from the PA output replica 120. This may cancel out the outgoing carrier and the incoming carrier to leave just the incoming modulation signal and carrier residue.

Figure 7:
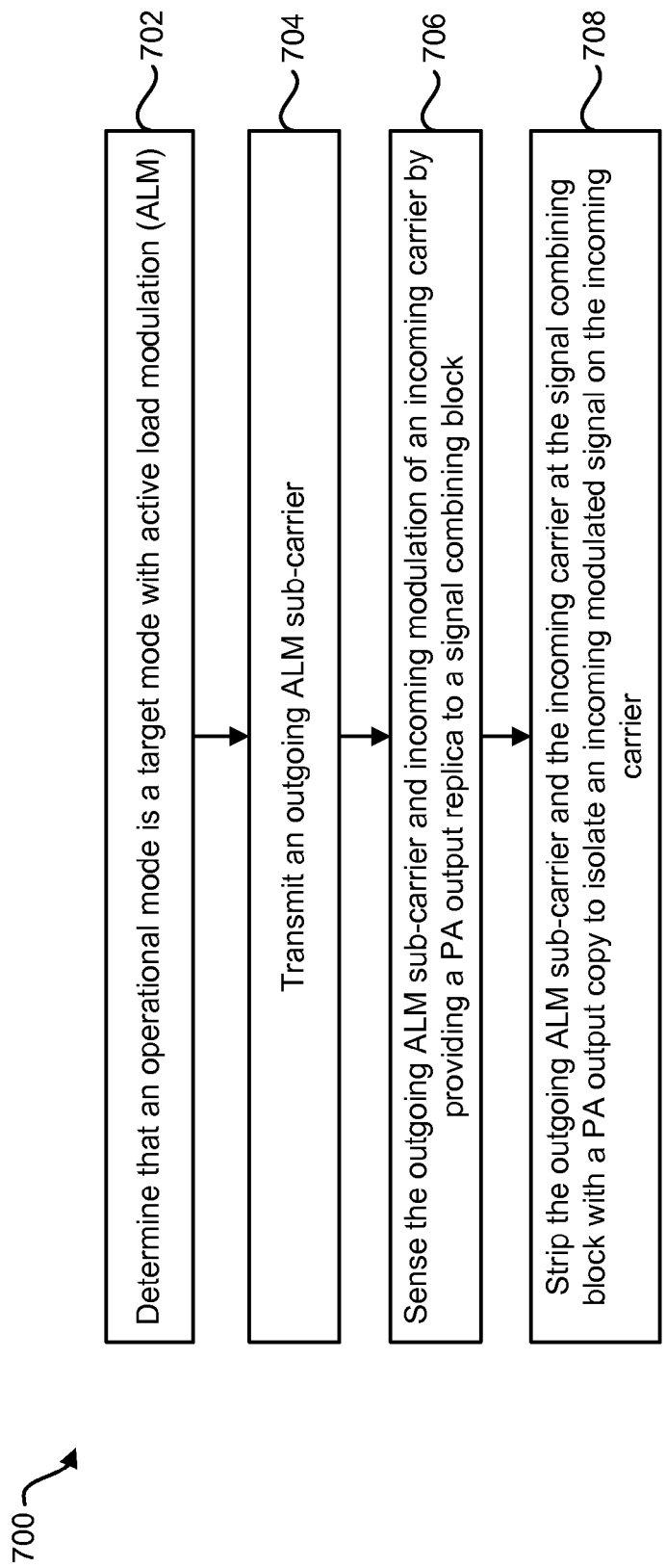
FIG. 7 is a flow diagram illustrating a method for performing a target mode with active load modulation (ALM)

FIG. 7 is a flow diagram illustrating a method 700 for performing a target mode with active load modulation (ALM). The method 700 may be implemented by a wireless communication device 102. The wireless communication device 102 may be configured with an NFC block 106 for communication with a remote device 104. The NFC block 106 may perform multiple operational modes 124 using a PA output replica 120, a PA output copy 122 and a signal combining block 116.

The wireless communication device 102 may determine 702 that the NFC operational mode 124 is target mode with ALM. In this operational mode 124, the wireless communication device 102 is acting as the target and the remote device 104 is the reader. The wireless communication device 102 may receive a modulated signal from the remote device 104. The wireless communication device 102 may also perform ALM with the remote device 104.

The wireless communication device 102 may transmit 704 an outgoing ALM sub-carrier. For example, a PA 110 may provide the ALM sub-carrier to the matching network 112 and antenna 114 for transmission to the remote device 104. The wireless communication device 102 may also maintain a controlled output impedance connection to the matching network 112 and antenna 114, as opposed to leaving the circuit disconnected and at a higher impedance, which leads to un-damped responses and high induced voltage levels at the chip package pins that can damage the circuits.

The wireless communication device 102 may sense 706 the outgoing ALM sub-carrier and incoming modulation of an incoming carrier by providing the PA output replica 120 to the signal combining block 116. The PA output replica 120 may be fed to the signal combining block 116 for sensing 706 the outgoing ALM sub-carrier and the incoming modulation of the incoming carrier from an external reader (e.g., remote device 104).

The wireless communication device 102 may strip 708 the outgoing ALM sub-carrier and the incoming carrier at the signal combining block 116 with the PA output copy 122 to isolate the incoming modulated signal on the incoming carrier. For example, the PA output copy 122 may be fed to the signal combining block 116. The signal combining block 116 may subtract the PA output copy 122 from the PA output replica 120. This may cancel out the outgoing ALM sub-carrier and the incoming carrier to leave just the incoming modulated signal and carrier residue.

Figure 8:
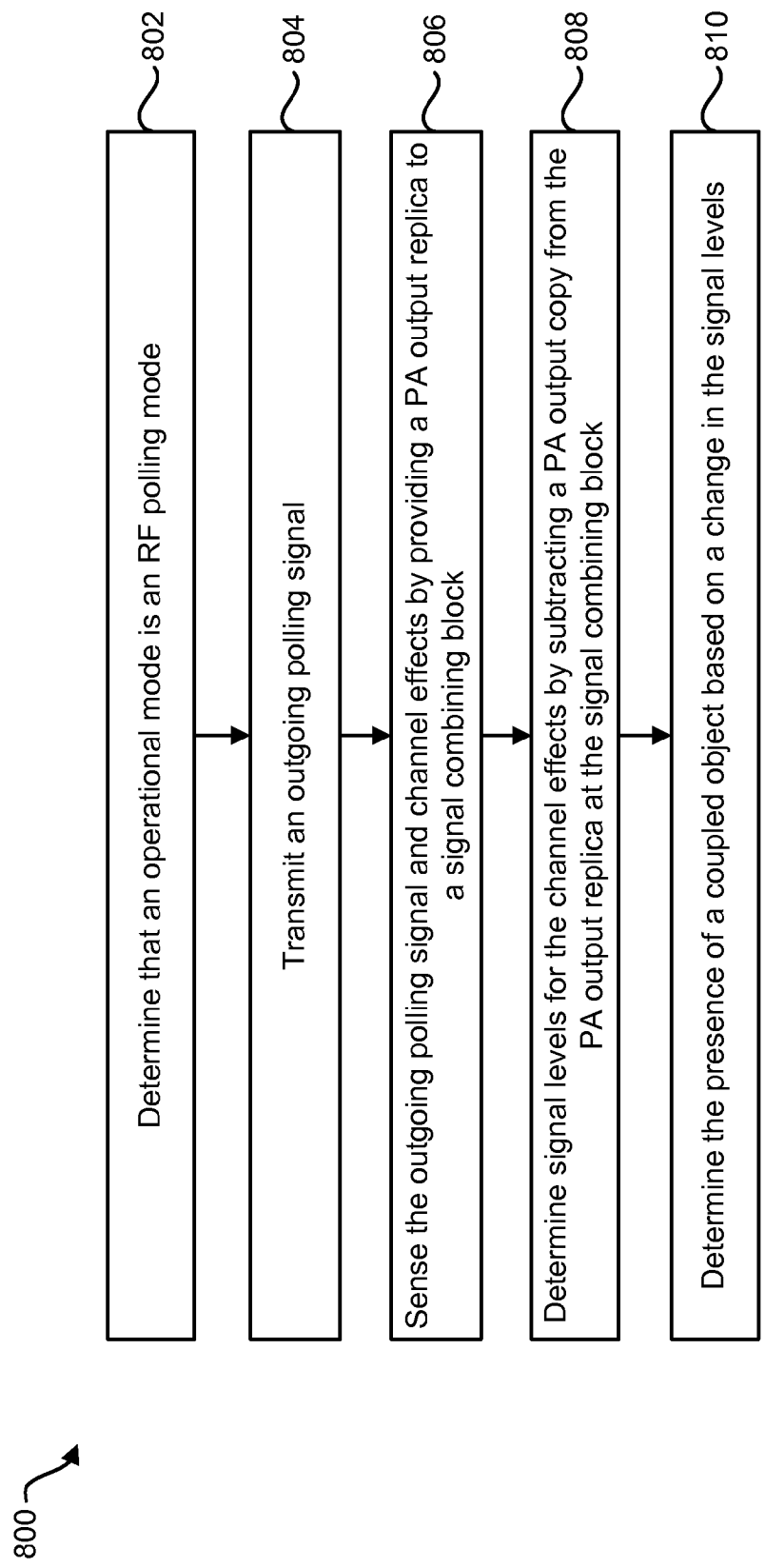
FIG. 8 is a flow diagram illustrating one configuration of a method for performing an RF polling mode.

FIG. 8 is a flow diagram illustrating one configuration of a method 800 for performing an RF polling mode. The method 800 may be implemented by a wireless communication device 102. The wireless communication device 102 may be configured with an NFC block 106 for communication with a remote device 104. The NFC block 106 may perform multiple operational modes 124 using a PA output replica 120, a PA output copy 122 and a signal combining block 116.

The wireless communication device 102 may determine 802 that the NFC operational mode 124 is an RF polling mode. In this operational mode 124, the wireless communication device 102 may poll for an external device (e.g., remote device 104).

The wireless communication device 102 may transmit 804 an outgoing polling signal. The polling signal may be a low level carrier frequency sweep, multitone or wide-band (e.g., pulse, PRBS, etc.) signal transmitted by the PA 110 to the external outputs (e.g., matching network 112 and antenna 114.

The wireless communication device 102 may sense 806 the outgoing polling signal and channel effects by providing the PA output replica 120 to the signal combining block 116. The PA output replica 120 may contain the transmitted polling signal and effects from the output channel 126 properties.

The wireless communication device 102 may determine 808 signal levels for the channel effects by subtracting the PA output copy 122 from the PA output replica 120 at the signal combining block 116. In this case, the signal combining block 116 may be a summer 316 block that performs time domain summing of the PA output replica 120 and the PA output copy 122.

The wireless communication device 102 may determine 810 the presence of a coupled object (e.g., remote device 104) based on a change in the signal levels. The result will vary over the frequency band according to the channel properties.

Figure 9:
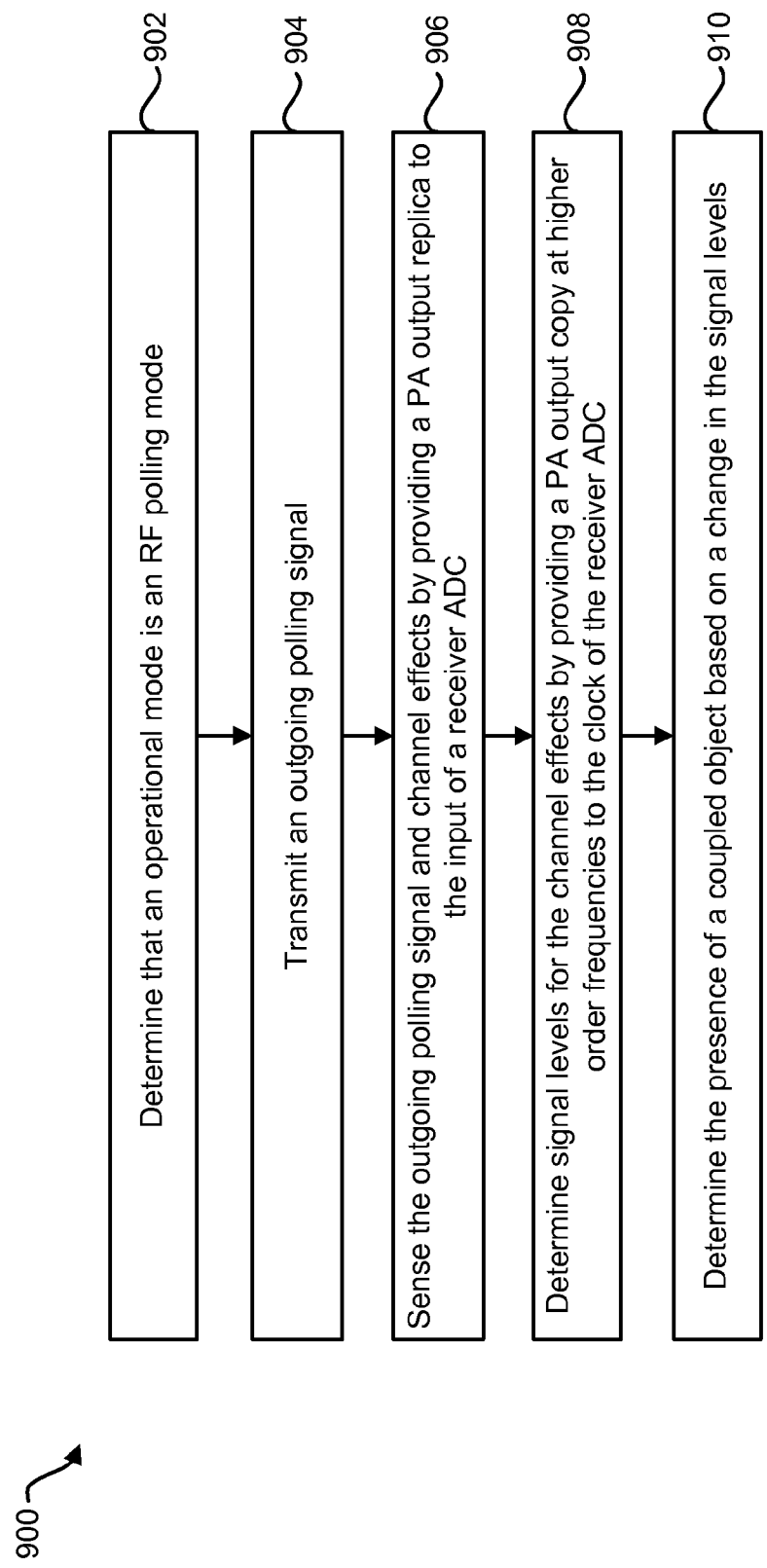
FIG. 9 is a flow diagram illustrating another configuration of a method for performing an RF polling mode.

FIG. 9 is a flow diagram illustrating another configuration of a method 900 for performing an RF polling mode. The method 900 may be implemented by a wireless communication device 102. The wireless communication device 102 may be configured with an NFC block 106 for communication with a remote device 104. The NFC block 106 may perform multiple operational modes 124 using a PA output replica 120, a PA output copy 122 and a signal combining block 116. In this implementation, the signal combining block 116 may include a receiver analog-to-digital converter (ADC) 129

The wireless communication device 102 may determine 902 that the NFC operational mode 124 is an RF polling mode. In this operational mode 124, the wireless communication device 102 may poll for an external device (e.g., remote device 104).

The wireless communication device 102 may transmit 904 an outgoing polling signal. The polling signal may be a low level carrier frequency sweep, multitone or wide-band (e.g., pulse, PRBS, etc.) signal transmitted by the PA 110 to the external outputs (e.g., matching network 112 and antenna 114.

The wireless communication device 102 may sense 906 the outgoing polling signal and channel effects by providing the PA output replica to an input of the receiver ADC 129. The PA output replica 120 may contain the transmitted polling signal and effects from the output channel 126 properties.

The wireless communication device 102 may determine 908 signal levels for the channel effects by providing the PA output copy 122 at higher order frequencies to a clock of the receiver ADC 129. The PA output copy 122 may provide a variable or multiplied clock frequency to the ADC 129. The ADC 129 clock can be swept at a multiple of the channel frequency to be analyzed, in order to digitize the entire channel bandwidth. Corresponding digital codes may be produced that capture the effects of the channel 126 on the frequencies within the channel bandwidth.

The wireless communication device 102 may determine 910 the presence of a coupled object (e.g., remote device 104) based on a change in the signal levels. The result will vary over the frequency band according to the channel properties.

Figure 10:
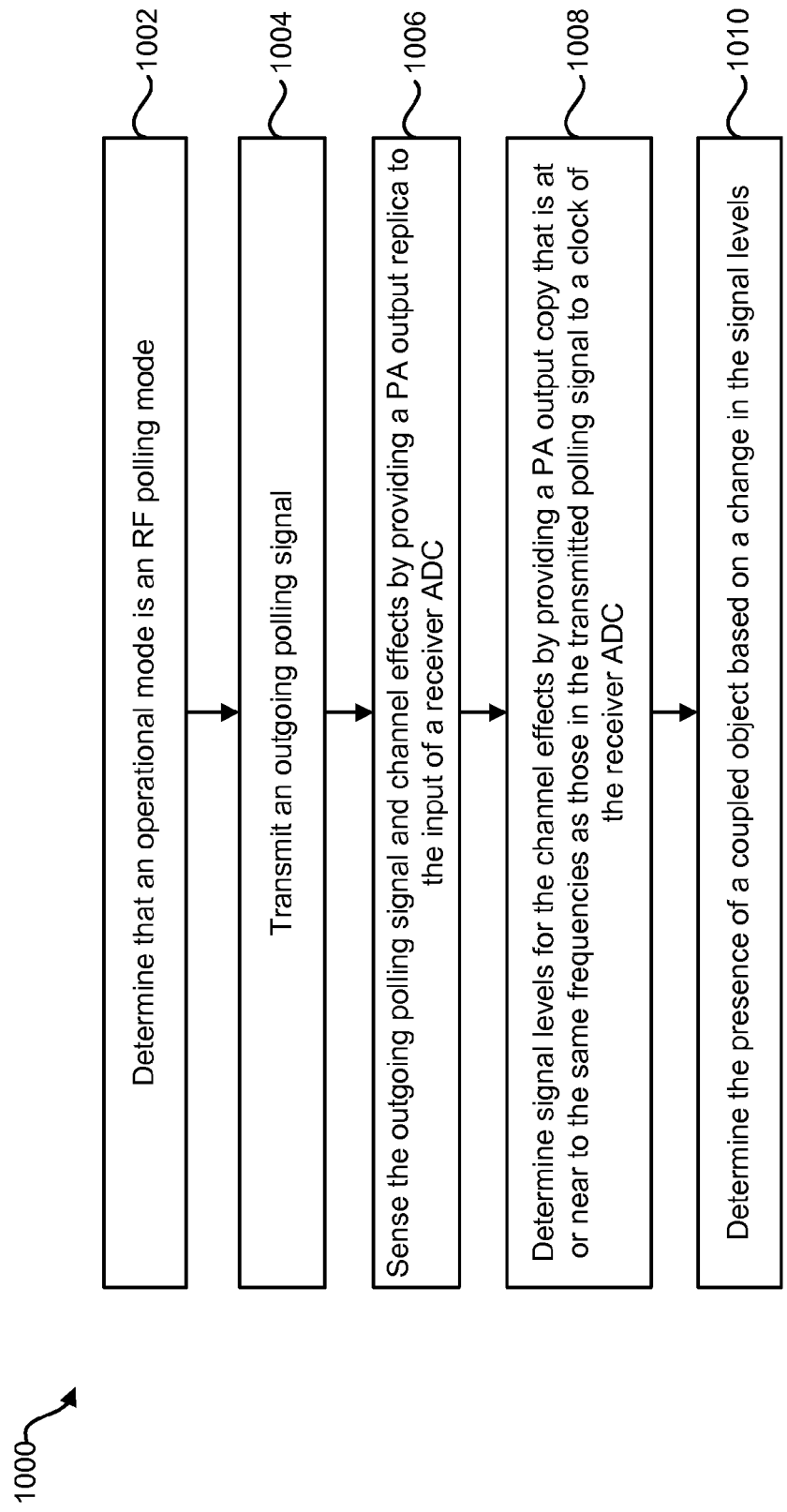
FIG. 10 is a flow diagram illustrating yet another configuration of a method for performing an RF polling mode.

FIG. 10 is a flow diagram illustrating yet another configuration of a method 1000 for performing an RF polling mode. The method 1000 may be implemented by a wireless communication device 102. The wireless communication device 102 may be configured with an NFC block 106 for communication with a remote device 104. The NFC block 106 may perform multiple operational modes 124 using a PA output replica 120, a PA output copy 122 and a signal combining block 116. In this implementation, the signal combining block 116 may include a receiver analog-to-digital converter (ADC) 129.

The wireless communication device 102 may determine 1002 that the NFC operational mode 124 is an RF polling mode. In this operational mode 124, the wireless communication device 102 may poll for an external device (e.g., remote device 104).

The wireless communication device 102 may transmit 1004 an outgoing polling signal. The polling signal may be a low level carrier frequency sweep, multitone or wide-band (e.g., pulse, PRBS, etc.) signal transmitted by the PA 110 to the external outputs (e.g., matching network 112 and antenna 114.

The wireless communication device 102 may sense 1006 the outgoing polling signal and channel effects by providing the PA output replica to an input of the receiver ADC 129. The PA output replica 120 may contain the transmitted polling signal and effects from the output channel 126 properties.

The wireless communication device 102 may determine 1008 signal levels for the channel effects by providing the PA output copy that is at or near to the same frequencies as those in the transmitted polling signal to a clock of the receiver ADC 129. The PA output copy 122 may provide a variable or multiplied clock frequency to the ADC 129. The ADC 129 clock can be swept on or near to the same frequency as those in the transmitted polling signal in order to digitize the entire channel bandwidth. Corresponding digital codes may be produced that capture the effects of the channel 126 on the frequencies within the channel bandwidth. In this case, the signal levels may be directly down-converted to DC. Down-conversion here may be done directly by the ADC 129 by having ADC 129 clock and signal correlated.

The wireless communication device 102 may determine 1010 the presence of a coupled object (e.g., remote device 104) based on a change in the resulting directly down-converted signal levels. The result will vary over the frequency band according to the channel properties.

Figure 11:
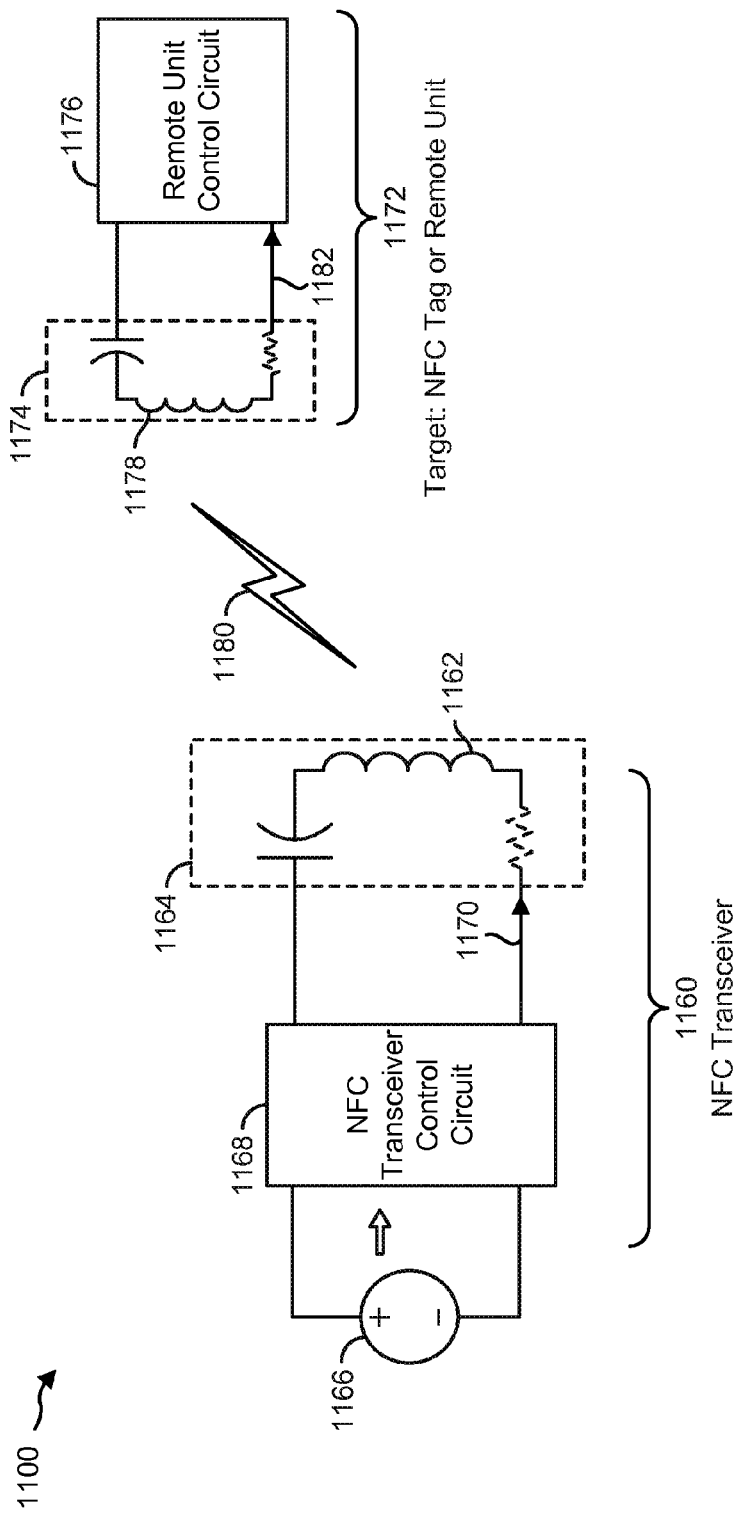
FIG. 11 is a block diagram illustrating an exemplary schematic of an NFC system including a transceiver and a remote unit.

FIG. 11 is a block diagram illustrating an exemplary schematic of an NFC system 1100 including a transceiver 1160 and a remote unit 1172. The NFC system 1100 includes an NFC transceiver 1160 and a remote unit 1172 such as an NFC tag. The NFC transceiver 1160 may include a voltage power source 1166, an NFC transceiver control circuit 1168 and a transmitter circuit 1164. The NFC transceiver control circuit 1168 is powered by the voltage source 1166, and connected to one or more transceiver loops 1162.

The transceiver loops 1162 are hereinafter interchangeably used with coils or loop antennae. The coils and loop antenna may be made of conductive material, for example, an electromagnetic coil, through which an alternating current (AC) 1170 can flow. The transceiver loops 1162 may be circular, oval, and the like, although other sizes and shapes are possible.

For near-field communication, the AC current 1170 flowing through the transceiver loops 1162 can result in transmitting magnetic energy or magnetic flux 1180 at various frequencies (e.g., about 100 kHz to about 110 MHz). In a near-field case, the wavelength of the emitted frequencies may be much longer than the size of the loops 1162 on the NFC transceiver 1160.

The remote unit 1172 includes a receiver circuit 1174 and a remote unit control circuit 1176. If the remote unit 1172 is close enough to the NFC transceiver 1160, the magnetic flux 1180 from the transceiver 1160 can get AC coupled onto one or more remote unit loops 1178 of conductive material, which can be an unpowered device (i.e., without a battery or other means of applying continuous power) having the electromagnetic coil and remote unit control circuit 1176.

An oscillating AC current 1182 flowing in alternating directions in the remote unit control circuit 1176 can be rectified by a rectifying diode in the remote unit control circuit 1176, which can cause a voltage to be built up across a bypass capacitor in the remote unit control circuit 1176. Once the bypass capacitor has built up a sufficient voltage, the remote unit control circuit 1176 can become powered up and operational. By receiving coupled and modulated AC signal from the NFC transceiver 1160, the remote unit 1172 can receive and detect information (e.g., commands) from the NFC transceiver 1160.

Once operational, the remote unit control circuit 1176 may also send signals back to the NFC transceiver 1160 by changing the impedance seen by the remote unit loops 1178. This can be accomplished by shunting or opening the remote unit loops 1178 with, for example, a switch. If the remote unit 1172 is close enough to the NFC transceiver 1160, the modulated electromagnetic field generated by the remote unit loops 1178 in the remote unit 1172 can be coupled back onto the loops 1162 of the NFC transceiver 1160. The signals sent back to the NFC transceiver 1160 can be slow and on the order of 100 bits of data, and provide information back to the transceiver 1160 such as the serial number or model number of the device to which the remote unit 1172 is attached, credit card number, personal identification information, security codes and passwords, and the like.

Figure 12:
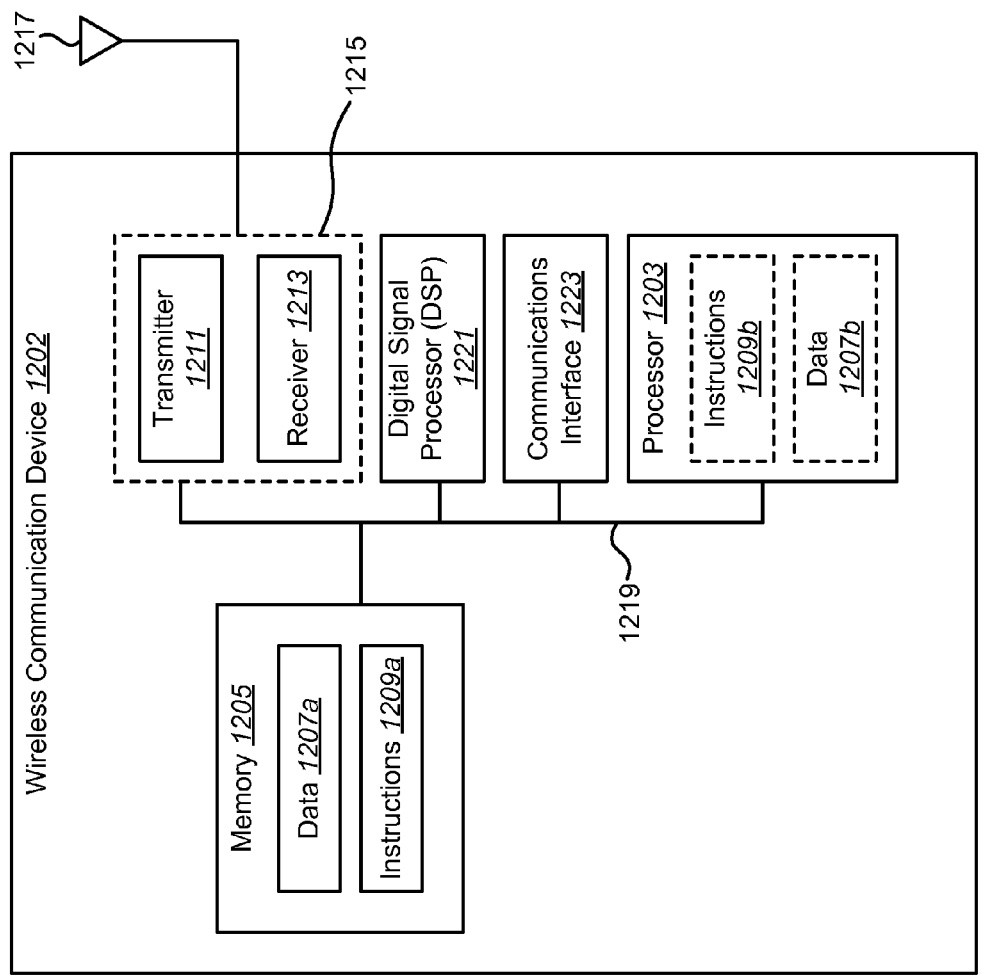
FIG. 12 illustrates certain components that may be included within a wireless communication device.

FIG. 12 illustrates certain components that may be included within a wireless communication device 1202. The wireless communication device 1202 may be a wireless device, an access terminal, a mobile station, a user equipment (UE), a laptop computer, a desktop computer, etc. For example, the wireless communication device 1202 of FIG. 12 may be implemented in accordance with the wireless communication device 102 of FIG. 1.

The wireless communication device 1202 includes a processor 1203. The processor 1203 may be a general purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 1203 may be referred to as a central processing unit (CPU). Although just a single processor 1203 is shown in the wireless communication device 1202 of FIG. 12, in an alternative configuration, a combination of processors (e.g., an ARM and DSP) could be used.

The wireless communication device 1202 also includes memory 1205 in electronic communication with the processor 1203 (i.e., the processor can read information from and/or write information to the memory). The memory 1205 may be any electronic component capable of storing electronic information. The memory 1205 may be configured as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 1207a and instructions 1209a may be stored in the memory 1205. The instructions 1209a may include one or more programs, routines, sub-routines, functions, procedures, code, etc. The instructions 1209a may include a single computer-readable statement or many computer-readable statements. The instructions 1209a may be executable by the processor 1203 to implement the methods disclosed herein. Executing the instructions 1209a may involve the use of the data 1207a that is stored in the memory 1205. When the processor 1203 executes the instructions 1209, various portions of the instructions 1209b may be loaded onto the processor 1203, and various pieces of data 1207b may be loaded onto the processor 1203.

The wireless communication device 1202 may also include a transmitter 1211 and a receiver 1213 to allow transmission and reception of signals to and from the wireless communication device 1202 via an antenna 1217. The transmitter 1211 and receiver 1213 may be collectively referred to as a transceiver 1215. The wireless communication device 1202 may also include (not shown) multiple transmitters, multiple antennas, multiple receivers and/or multiple transceivers.

The wireless communication device 1202 may include a digital signal processor (DSP) 1221. The wireless communication device 1202 may also include a communications interface 1223. The communications interface 1223 may allow a user to interact with the wireless communication device 1202.

The various components of the wireless communication device 1202 may be coupled together by one or more buses, which may include a power bus, a control signal bus, a status signal bus, a data bus, etc. For the sake of clarity, the various buses are illustrated in FIG. 12 as a bus system 1219.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a digital signal processor (DSP) and a microprocessor, a plurality of microprocessors, one or more microprocessors in conjunction with a digital signal processor (DSP) core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-Ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 2 and FIGS. 5-10, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for inductively coupled communication, comprising:
   determining a first operational mode for inductively coupled communication, wherein the first operational mode comprises a radio frequency (RF) polling mode;
   performing the first operational mode by combining a transmit power amplifier (PA) output replica and a PA output copy at a signal combining block of a receiver, wherein the PA output replica reflects effects of channel properties, and wherein the PA output copy is unaffected by the channel properties;
   determining a second operational mode for inductively coupled communication; and
   performing the second operational mode by combining the transmit PA output replica and the PA output copy at the signal combining block of the receiver.

2. The method of claim 1, wherein the channel properties comprise loading conditions in relation to at least one of an antenna, matching network, coupling to a remote device, or load modulation.

3. The method of claim 1, wherein the signal combining block performs time domain summing of the PA output replica and the PA output copy, wherein the PA output copy is subtracted from the PA output replica.

4. The method of claim 1, wherein the signal combining block performs frequency translation.

5. The method of claim 1, wherein phase, frequency and amplitude alignments of the PA output replica and the PA output copy are variable with respect to each other, and with respect to incoming received signals.

6. The method of claim 5, wherein poly-phase, multi-tone and amplitude variable aspects of the PA output replica and the PA output copy are implemented in analog, digital or a combination of both analog and digital portions of a near-field communication (NFC) block.

7. The method of claim 1, wherein the operational mode is a reader mode with target load modulation, and wherein performing the operational mode comprises:
   transmitting an outgoing carrier;
   sensing incoming load modulation of the outgoing carrier by providing the PA output replica to the signal combining block; and
   stripping the outgoing carrier at the signal combining block with the PA output copy to isolate an incoming load modulation signal and carrier residue.

8. The method of claim 1, wherein the operational mode is a target mode, and wherein performing the operational mode comprises:
   transmitting a low level outgoing carrier to maintain a controlled output impedance connection at a matching network and antenna;
   sensing incoming modulation of an incoming carrier by providing the PA output replica to the signal combining block; and
   stripping the outgoing carrier and incoming carrier at the signal combining block with the PA output copy with a weighted output level to isolate an incoming modulation signal.

9. The method of claim 1, further comprising performing a phase lock on an incoming carrier based on a summing error generated by summing the PA output replica and the PA output copy at the signal combining block.

10. The method of claim 1, wherein the operational mode is a target mode with active load modulation (ALM), and wherein performing the operational mode comprises:
    transmitting an outgoing ALM sub-carrier;
    sensing the outgoing ALM sub-carrier and incoming modulation of an incoming carrier by providing the PA output replica to the signal combining block; and
    stripping the outgoing ALM sub-carrier and the incoming carrier at the signal combining block with the PA output copy to isolate an incoming modulation signal on the incoming carrier.

11. The method of claim 1, wherein the operational mode is a radio frequency (RF) polling mode, and wherein performing the operational mode comprises:
    transmitting an outgoing polling signal;
    sensing the outgoing polling signal and channel effects by providing the PA output replica to the signal combining block;
    determining signal levels for the channel effects by subtracting the PA output copy from the PA output replica at the signal combining block; and
    determining the presence of a coupled object based on a change in the signal levels.

12. The method of claim 1, wherein the operational mode is an RF polling mode, the signal combining block comprises a receiver analog-to-digital converter (ADC), and wherein performing the operational mode comprises:
    transmitting an outgoing polling signal;
    sensing the outgoing polling signal and channel effects by providing the PA output replica to an input of the receiver ADC;
    determining signal levels for the channel effects by providing the PA output copy at higher order frequencies to a clock of the receiver ADC; and
    determining the presence of a coupled object based on a change in the signal levels.

13. The method of claim 1, wherein the operational mode is an RF polling mode, the signal combining block comprises a receiver analog-to-digital converter (ADC), and wherein performing the operational mode comprises:
    transmitting an outgoing polling signal;
    sensing the outgoing polling signal and channel effects by providing the PA output replica to an input of the receiver ADC;
    determining signal levels for the channel effects by providing the PA output copy that is at or near frequencies of the transmitted polling signal to a clock of the receiver ADC; and determining the presence of a coupled object based on a change in resulting directly down-converted signal levels.

14. The method of claim 1, wherein the first operational mode comprises a first near-field communication (NFC) operational mode and the second operational mode comprises a second NFC operational mode different than the first NFC operational mode.

15. The method of claim 1, wherein the first operational mode and the second operational mode are performed using the PA output replica, the PA output copy, and the signal combining block.

16. The method of claim 1, wherein the second operational mode comprises a reader mode or a target mode.

17. A wireless communication device for inductively coupled communication, comprising:
 a processor;
 a memory in communication with the processor; and
 instructions stored in the memory, the instructions executable by the processor to:
  determine a first operational mode for inductively coupled communication, wherein the first operational mode comprises a radio frequency (RF) polling mode;
  perform the first operational mode by combining a transmit power amplifier (PA) output replica and a PA output copy at a signal combining block of a receiver, wherein the PA output replica reflects effects of channel properties, and wherein the PA output copy is unaffected by the channel properties;
  determine a second operational mode for inductively coupled communication; and
  perform the second operational mode by combining the transmit PA output replica and the PA output copy at the signal combining block of the receiver.

18. The wireless communication device of claim 17, wherein the operational mode is a reader mode with target load modulation, and wherein the instructions executable to perform the operational mode comprise instructions executable to:
 transmit an outgoing carrier;
 sense incoming load modulation of the outgoing carrier by providing the PA output replica to the signal combining block; and
 strip the outgoing carrier at the signal combining block with the PA output copy to isolate an incoming load modulation signal and carrier residue.

19. The wireless communication device of claim 17, wherein the operational mode is a target mode, and wherein the instructions executable to perform the operational mode comprise instructions executable to:
 transmit a low level outgoing carrier to maintain a controlled output impedance connection at a matching network and antenna;
 sense incoming modulation of an incoming carrier by providing the PA output replica to the signal combining block; and
 strip the outgoing carrier and incoming carrier at the signal combining block with the PA output copy with a weighted output level to isolate an incoming modulation signal.

20. The wireless communication device of claim 17, wherein the operational mode is a target mode with active load modulation (ALM), and wherein the instructions executable to perform the operational mode comprise instructions executable to:
 transmit an outgoing ALM sub-carrier;
 sense the outgoing ALM sub-carrier and incoming modulation of an incoming carrier by providing the PA output replica to the signal combining block; and
 strip the outgoing ALM sub-carrier and the incoming carrier at the signal combining block with the PA output copy to isolate an incoming modulation signal on the incoming carrier.

21. The wireless communication device of claim 17, wherein the operational mode is an RF polling mode, and wherein the instructions executable to perform the operational mode comprise instructions executable to:
 transmit an outgoing polling signal;
 sense the outgoing polling signal and channel effects by providing the PA output replica to the signal combining block;
 determine signal levels for the channel effects by subtracting the PA output copy from the PA output replica at the signal combining block; and
 determine the presence of a coupled object based on a change in the signal levels.

22. The wireless communication device of claim 17, wherein the operational mode is an RF polling mode, the signal combining block comprises a receiver analog-to-digital converter (ADC), and wherein the instructions executable to perform the operational mode comprise instructions executable to:
 transmit an outgoing polling signal;
 sense the outgoing polling signal and channel effects by providing the PA output replica to an input of the receiver ADC;
 determine signal levels for the channel effects by providing the PA output copy at higher order frequencies to a clock of the receiver ADC; and
 determine the presence of a coupled object based on a change in the signal levels.

23. The wireless communication device of claim 17, wherein the operational mode is an RF polling mode, the signal combining block comprises a receiver analog-to-digital converter (ADC), and wherein the instructions executable to perform the operational mode comprise instructions executable to:
 transmit an outgoing polling signal;
 sense the outgoing polling signal and channel effects by providing the PA output replica to an input of the receiver ADC;
 determine signal levels for the channel effects by providing the PA output copy that is at or near frequencies of the transmitted polling signal to a clock of the receiver ADC; and
 determine the presence of a coupled object based on a change in resulting directly down-converted signal levels.

24. An apparatus for inductively coupled communication, comprising:
 means for determining a first operational mode for inductively coupled communication wherein the first operational mode comprises a radio frequency (RF) polling mode;
 means for performing the first operational mode by combining a transmit power amplifier (PA) output replica and a PA output copy at a signal combining block of a receiver, wherein the PA output replica reflects effects of channel properties, and wherein the PA output copy is unaffected by the channel properties;
 means for determining a second operational mode for inductively coupled communication; and means for performing the second operational mode by combining the transmit PA output replica and the PA output copy at the signal combining block of the receiver.

25. The apparatus of claim 24, wherein the operational mode is a reader mode with target load modulation, and wherein the means for performing the operational mode comprise:
   means for transmitting an outgoing carrier;
   means for sensing incoming load modulation of the outgoing carrier by providing the PA output replica to the signal combining block; and
   means for stripping the outgoing carrier at the signal combining block with the PA output copy to isolate an incoming load modulation signal and carrier residue.

26. The apparatus of claim 24, wherein the operational mode is a target mode, and wherein the means for performing the operational mode comprise:
   means for transmitting a low level outgoing carrier to maintain a controlled output impedance connection at a matching network and antenna;
   means for sensing incoming modulation of an incoming carrier by providing the PA output replica to the signal combining block; and
   means for stripping the outgoing carrier and incoming carrier at the signal combining block with the PA output copy with a weighted output level to isolate an incoming modulation signal.

27. The apparatus of claim 24, wherein the operational mode is a target mode with active load modulation (ALM), and wherein the means for performing the operational mode comprise:
   means for transmitting an outgoing ALM sub-carrier;
   means for sensing the outgoing ALM sub-carrier and incoming modulation of an incoming carrier by providing the PA output replica to the signal combining block; and
   means for stripping the outgoing ALM sub-carrier and the incoming carrier at the signal combining block with the PA output copy to isolate an incoming modulation signal on the incoming carrier.

28. The apparatus of claim 24, wherein the operational mode is an RF polling mode, and wherein the means for performing the operational mode comprise:
   means for transmitting an outgoing polling signal;
   means for sensing the outgoing polling signal and channel effects by providing the PA output replica to the signal combining block;
   means for determining signal levels for the channel effects by subtracting the PA output copy from the PA output replica at the signal combining block; and
   means for determining the presence of a coupled object based on a change in the signal levels.

29. A computer-program product for inductively coupled communication, the computer-program product comprising a non-transitory computer-readable medium having instructions thereon, the instructions comprising:
   code for causing a wireless communication device to determine a first operational mode for inductively coupled communication, wherein the first operational mode comprises a radio frequency (RF) polling mode;
   code for causing the wireless communication device to perform the first operational mode by combining a transmit power amplifier (PA) output replica and a PA output copy at a signal combining block of a receiver, wherein the PA output replica reflects effects of channel properties, and wherein the PA output copy is unaffected by the channel properties;
   code for causing the wireless communication device to determine a second operational mode for inductively coupled communication; and
   code for causing the wireless communication device to perform the second operational mode by combining the transmit PA output replica and the PA output copy at the signal combining block of the receiver.

30. The computer-program product of claim 29, wherein the operational mode is a reader mode with target load modulation, and wherein the code for causing the wireless communication device to perform the operational mode comprises:
   code for causing the wireless communication device to transmit an outgoing carrier;
   code for causing the wireless communication device to sense incoming load modulation of the outgoing carrier by providing the PA output replica to the signal combining block; and
   code for causing the wireless communication device to strip the outgoing carrier at the signal combining block with the PA output copy to isolate an incoming load modulation signal and carrier residue.

31. The computer-program product of claim 29, wherein the operational mode is a target mode, and wherein the code for causing the wireless communication device to perform the operational mode comprises:
   code for causing the wireless communication device to transmit a low level outgoing carrier to maintain a controlled output impedance connection at a matching network and antenna;
   code for causing the wireless communication device to sense incoming modulation of an incoming carrier by providing the PA output replica to the signal combining block; and
   code for causing the wireless communication device to strip the outgoing carrier and incoming carrier at the signal combining block with the PA output copy with a weighted output level to isolate an incoming modulation signal.

32. The computer-program product of claim 29, wherein the operational mode is a target mode with active load modulation (ALM), and wherein the code for causing the wireless communication device to perform the operational mode comprises:
   code for causing the wireless communication device to transmit an outgoing ALM sub-carrier;
   code for causing the wireless communication device to sense the outgoing ALM sub-carrier and incoming modulation of an incoming carrier by providing the PA output replica to the signal combining block; and
   code for causing the wireless communication device to strip the outgoing ALM sub-carrier and the incoming carrier at the signal combining block with the PA output copy to isolate an incoming modulation signal on the incoming carrier.

33. The computer-program product of claim 29, wherein the operational mode is an RF polling mode, and wherein the code for causing the wireless communication device to perform the operational mode comprises:
   code for causing the wireless communication device to transmit an outgoing polling signal;
   code for causing the wireless communication device to sense the outgoing polling signal and channel effects by providing the PA output replica to the signal combining block;

code for causing the wireless communication device to determine signal levels for the channel effects by subtracting the PA output copy from the PA output replica at the signal combining block; and code for causing the wireless communication device to determine the presence of a coupled object based on a change in the signal levels.

\* \* \* \* \*